(12) United States Patent
Tseng

(10) Patent No.: US 6,528,402 B2
(45) Date of Patent: Mar. 4, 2003

(54) DUAL SALICIDATION PROCESS

(75) Inventor: Horng-Huei Tseng, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 32 days.

(21) Appl. No.: 09/790,513

(22) Filed: Feb. 23, 2001

(65) Prior Publication Data

US 2002/0119631 A1 Aug. 29, 2002

(51) Int. Cl.$^7$ ............... H01L 21/3205; H01L 21/4763
(52) U.S. Cl. ............... 438/592; 438/305; 438/683
(58) Field of Search .................. 438/305, 592, 438/683

(56) References Cited

U.S. PATENT DOCUMENTS

| | | | |
|---|---|---|---|
| 5,322,809 A | * | 6/1994 | Moslehi ............. 148/DIG. 147 |
| 5,656,519 A | * | 8/1997 | Mogami et al. ............. 438/303 |
| 5,891,784 A | * | 4/1999 | Cheung et al. ............. 438/303 |
| 5,930,617 A | * | 7/1999 | Wu ............................. 438/233 |
| 5,956,584 A | * | 9/1999 | Wu ............................. 438/232 |
| 5,981,365 A | * | 11/1999 | Cheek et al. ................ 438/257 |
| 6,063,681 A | * | 5/2000 | Son ............................. 438/303 |
| 6,090,653 A | * | 7/2000 | Wu ............................. 438/231 |
| 6,100,173 A | * | 8/2000 | Gardner et al. ............. 438/592 |

* cited by examiner

Primary Examiner—John F. Niebling
Assistant Examiner—Angel Roman
(74) Attorney, Agent, or Firm—Intellectual Property Solutions, Incorporated

(57) ABSTRACT

A dual salicidation process has the steps of: covering a sacrificial layer on the top of a polysilicon gate conductor; performing a thermal oxidization process to form a poly-oxide spacer on the sidewall of the polysilicon gate conductor; forming source/drain regions within the substrate at the outer lateral surfaces of the poly-oxide spacer;removing the sacrificial layer; performing a first salicidation process to convert the polysilicon gate conductor to a silicide gate conductor; performing a second salicidation process to form silicide structures upon the source/drain regions.

12 Claims, 8 Drawing Sheets

DUAL SALICIDATION PROCESS

BACKGROUND OF THE INVENTION

1. Field of the Invention

The present invention relates in general to an integrated circuit fabrication. In particular, the present invention relates to a dual salicidation process that can form a silicide gate conductor having a greater thickness than a silicide structure on a source/drain region.

2. Description of the Related Art

In integrated circuit fabrication, the gate conductor is commonly used as a channel region mask during the formation of the source and drain junctions. One of the disadvantages of using polysilicon as the gate conductor material, however, is that it has a significantly higher resistivity than metals, such as aluminum. The propagation delay of an integrated circuit employing a polysilicon gate conductor thus may be longer than desired. Consequently, the operational frequency that can be achieved by a circuit employing a polysilicon gate conductor is somewhat limited.

To reduce the contact resistance at the contact/junction and contact/gate conductor interfaces, self-aligned low resistivity structures are commonly placed between the ohmic contacts and the junctions/gate conductors. The presence of these so-called self-aligned silicides (i.e., salicides) upon the junctions and gate conductors ensures that contact is made to the entire junction and gate areas. Further, forming salicide upon a polysilicon gate conductor helps lower the sheet resistance of the gate conductor. Salicide formed upon polysilicon is generally referred to as polycide.

Transistor device dimensions have been continuously reduced to accommodate the high demand for faster, more complex integrated circuits. As such, the source and drain junction depths have been reduced. Unfortunately, a salicide may completely consume a relatively shallow junction and penetrate into the substrate underneath the junction, a phenomenon known as "junction spiking". Junction spiking may undesirably cause the junction to exhibit large current leakage or become electrically shorted. Therefore, in order to prevent excessive consumption of shallow junctions during contact formation, the junction salicide can only be of limited thickness. Since the gate and junction salicides are formed at the same time, the gate salicide also has a limited thickness. However, it is desirable to form a relatively thick layer of salicide upon a gate conductor to lower the sheet resistance of the gate conductor. Accordingly, it would be of benefit to develop a salicidation process in which the junction salicides and the gate salicides have dissimilar thicknesses. That is, the salicidation process must no longer require concurrent formation of the junction salicides and the gate salicides.

Please refer to FIGS. 1A to 1I, which depict a dual salicidation process according to the prior art. As shown in FIG. 1A, a semiconductor substrate 10 comprises shallow trench isolation structures 12 arranged a spaced distance apart for isolating active areas, a gate dielectric 14 formed on the substrate 10, and a polysilicon gate conductor 16 patterned on the gate dielectric 14 by using well-known lithography and etch techniques. The gate dielectric 14 is made of a material having a K value greater than approximately 4. The gate conductor 16 is made by polysilicon.

Next, as shown in FIG. 1B, source-side/drain-side LDD areas 18 are formed by self-aligning an LDD implant to the opposed sidewall surfaces of gate conductor 16. Next, as shown in FIG. 1C, a dielectric material is deposited on the substrate 10 and then an anisotropical etching process is performed on the dielectric material. As a result, the dielectric material is only retained laterally adjacent the sidewalls surfaces of the gate conductor 16 in the form of sidewall spacers 22.

As shown in FIG. 1D, a S/D implant that is self-aligned to the outer lateral surfaces of the sidewall spacers 22 is then performed at a higher dose and energy than the LDD implant. In this manner, source and drain regions 24 are formed within substrate 10 a spaced distance from gate conductor 16. As such, LDD areas 18 and source and drain regions 24 form graded junctions which increase in concentration in a lateral direction away from gate conductor 16.

Thereafter, as shown in FIG. 1E, a first layer of refractory metal 26 is deposited across exposed surfaces of gate dielectric 14, sidewall spacers 22, and gate conductor 16. The first layer of refractory metal 26 may be made of cobalt and titanium. The first layer of refractory metal 26 may be subjected to radiation 28 to cause the metal atoms of the first layer of refractory metal 26 to undergo cross-diffusion and reaction with silicon atoms within polysilicon gate conductor 16. As a result, a majority of polysilicon gate conductor 24 may be converted into a silicide gate conductor 30, as shown in FIG. 1F. The excess refractory metal not consumed during this salicidation process is removed using a selective etch technique. The resulting silicide gate conductor 30 comprises $TiSi_2$ if Ti is used as the refractory metal and $CoSi_2$ if Co is used as the refractory metal.

Turning to FIG. 1G, the gate dielectric 14 may then be removed from source and drain regions 24. Subsequent to exposing the source and drain regions 24, a second layer of refractory metal 32, e.g., titanium or cobalt, may then be deposited across the semiconductor topography, as shown in FIG. 1H. The second layer of refractory metal 32 is substantially thinner than the first layer of refractory metal 26. The topography may then be exposed to radiation 34 to heat the second layer of refractory metal 32. As a result of being annealed, metal atoms within the second layer of refractory metal 32 may react within underlying Si atoms of substrate 10. In this manner, silicide structures 36 comprising, e.g., $TiSi_2$ or $CoSi_2$ are formed upon the source and drain regions 36, as shown in FIG. 1I. Any non-reacted refractory metal may be selectively etched away.

SUMMARY OF THE INVENTION

An object of the present invention is to provide a dual salicidation process to form a relatively thick layer of the silicide gate conductor to lower the sheet resistance of the gate conductor.

The dual salicidation process of the present invention includes the steps of: covering a sacrificial layer on the top of a polysilicon gate conductor; performing a thermal oxidization process to form a poly-oxide spacer on the sidewall of the polysilicon gate conductor; forming source/drain regions within the substrate at the outer lateral surfaces of the poly-oxide spacer ; removing the sacrificial layer; performing a first salicidation process to convert the polysilicon gate conductor to a silicide gate conductor; performing a second salicidation process to form silicide structures upon the source/drain regions.

It is an advantage of the present invention that the two-step salicidation process ensures that excessive consumption of source/drain regions does not occur during the formation of silicide gate conductor. Also, it is desirable to form a relatively thick layer of the silicide gate conductor to lower the sheet resistance of the gate conductor. Accordingly, the silicide structures and the silicide gate conductor have dissimilar thicknesses. Besides, the poly-oxide spacer is self-aligned and formed by the thermal oxidization process and thereby the steps of depositing dielectrics and anisotropical etching process can be omitted. This can simplify the dual salicidation process and is applied to fabricating a smaller-scale gate conductor.

This and other objectives of the present invention will no doubt become obvious to those of ordinary skill in the art after having read the following detailed description of the preferred embodiment, which is illustrated in the various figures and drawings.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

Figure 1A:
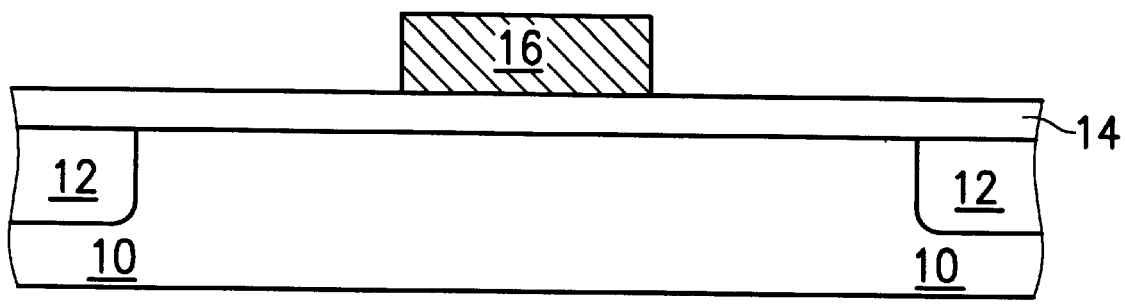
FIGS. 1A to 1I depicts a dual salicidation process according to the prior ark.
Figure 1B:
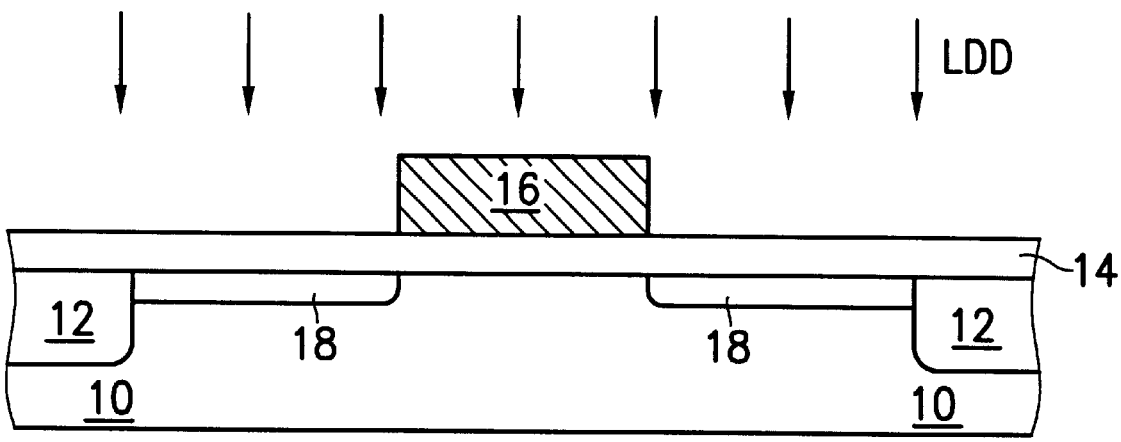
Figure 1C:
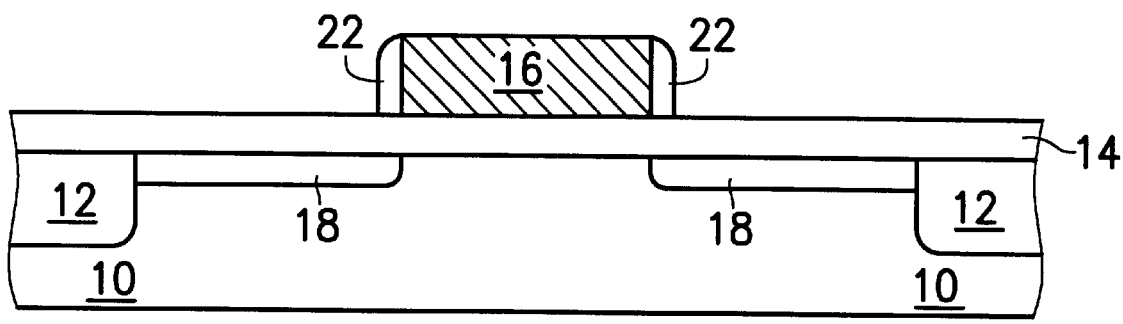
Figure 1D:
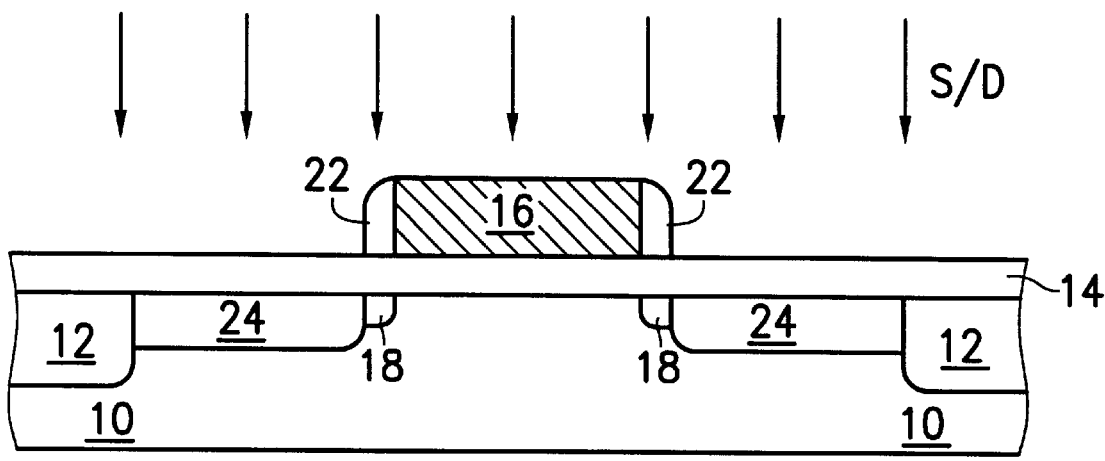
Figure 1E:
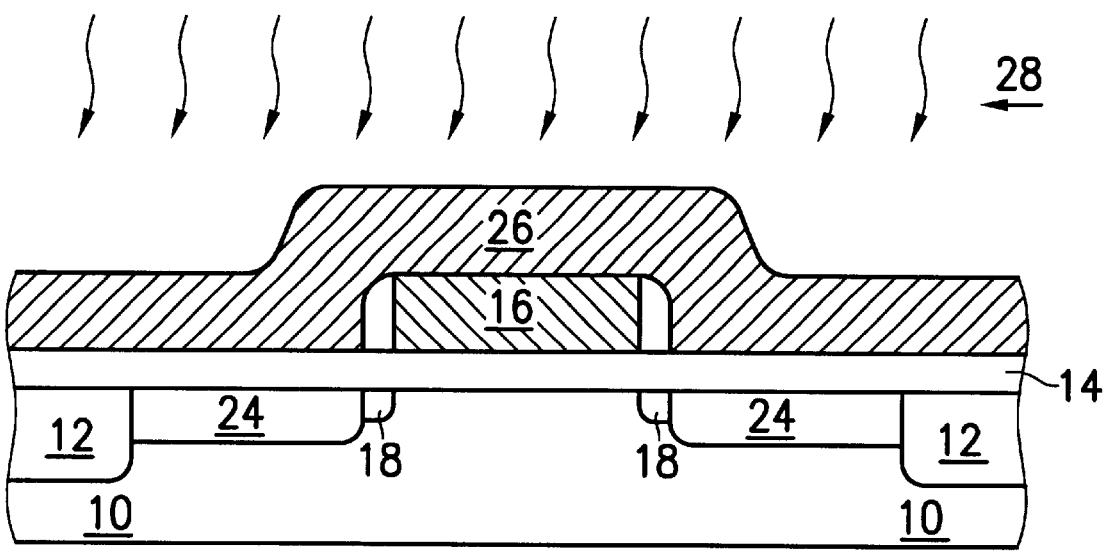
Figure 1F:
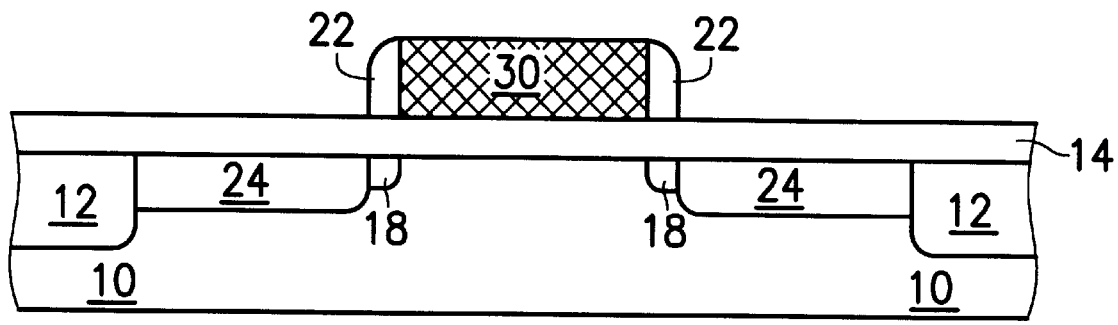
Figure 1G:
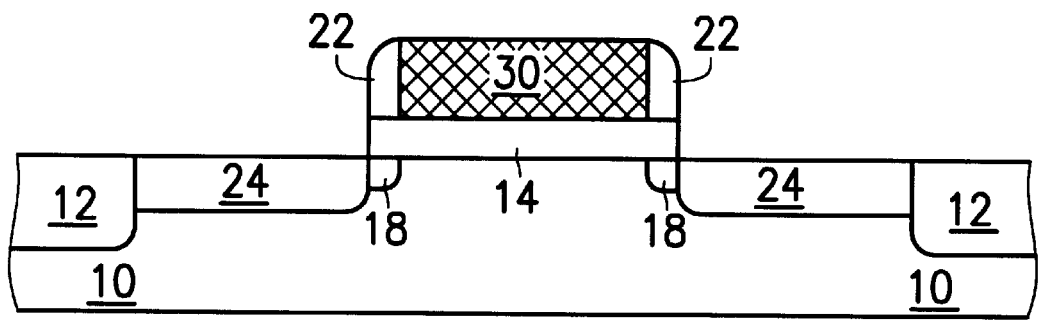
Figure 1H:
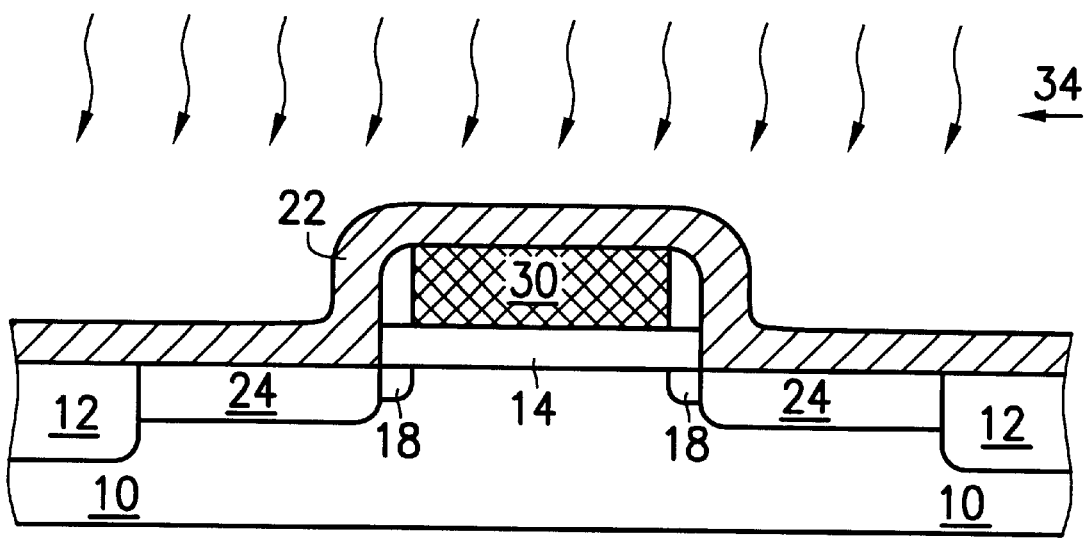
Figure 1I:
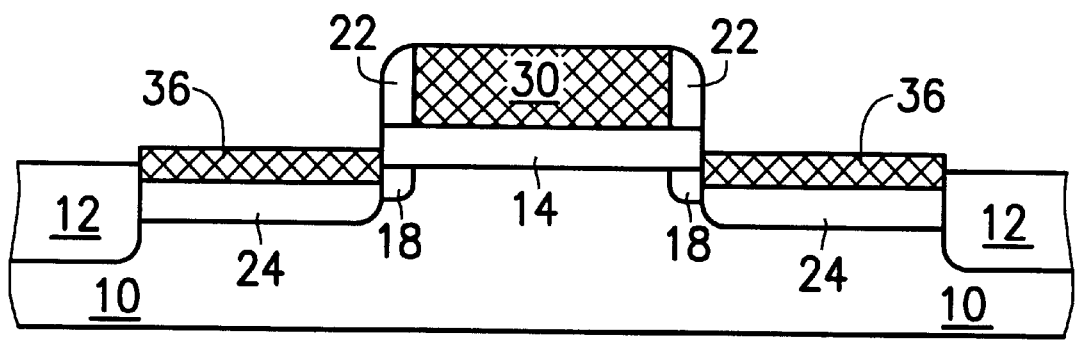
Figure 2A:
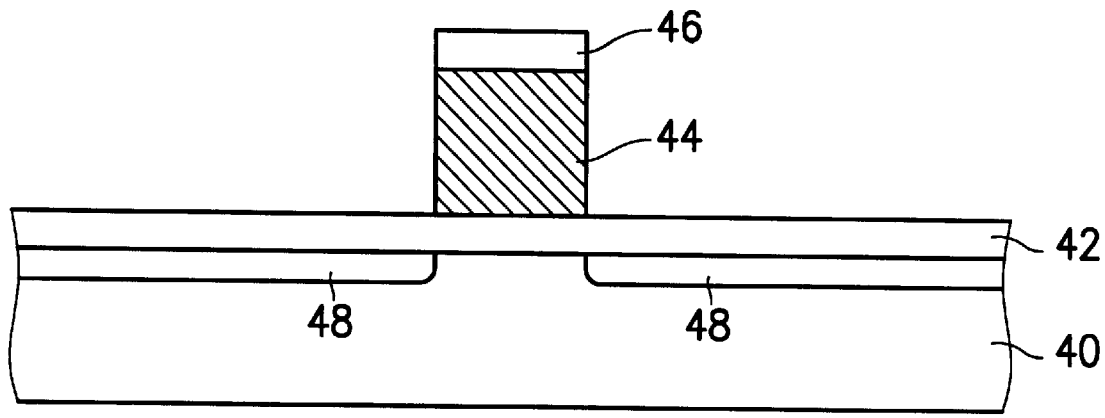
FIGS. 2A to 2H depicts a dual salicidation process according to the present invention.

Please refer to FIGS. 2A to 2H, which depict a dual salicidation process according to the present invention. As shown in FIG. 2A, a semiconductor substrate 40 comprises shallow trench isolation structures (not shown) arranged a spaced distance apart for isolating active areas, a gate dielectric 42 formed on the substrate 40, a polysilicon gate conductor 44 patterned on the gate dielectric 42 by using well-known lithography and etch techniques, and a sacrificial layer 46 patterned on the polysilicon gate conductor 44. The substrate 40 is made of single crystalline silicon, which has been slightly doped with n-type or p-type impurities. The gate dielectric 44 is made of silicon oxide with a thickness of 50~500 Å. The gate conductor 44 is made of polysilicon. The sacrificial layer 46 is made of an anti-oxidization material and is different from the gate dielectric 42, such as silicon nitride or silicon-oxy-nitride. Using the gate conductor 44 and the sacrificial layer 46 as the mask, source-side/drain-side LDD areas 48 are formed by self-aligning an LDD implant to the opposed sidewall surfaces of gate conductor 44. The formation of an NMOS transistor requires an LDD implant of n-type dopants, and the formation of a PMOS transistor requires an LDD implant of p-type dopants.

Figure 2B:
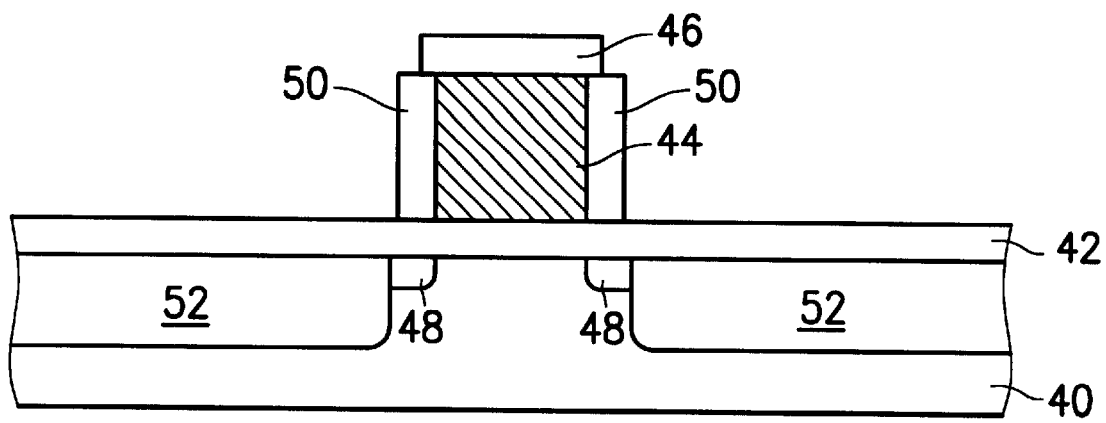

Next, as shown in FIG. 2B, a thermal oxidation process is performed to oxidize the exposed sidewall of the gate conductor 44. Thereby, a poly-oxide spacer 50 is only formed laterally adjacent the sidewall of the gate conductor 44. Then, a S/D implant that is self-aligned to the outer lateral surfaces of the poly-oxide spacer 50 is performed at a higher dose and energy than the LDD implant. In this manner, source/drain regions 52 are formed within substrate 40 a spaced distance from gate conductor 44. As such, the LDD areas 48 and the source/drain regions 52 form graded junctions, which increase in concentration in a lateral direction away from the gate conductor 44.

Figure 2C:
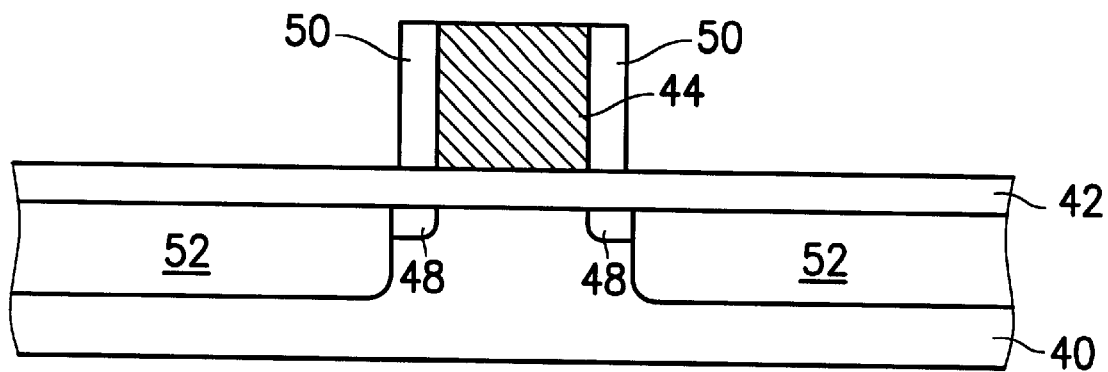
Figure 2D:
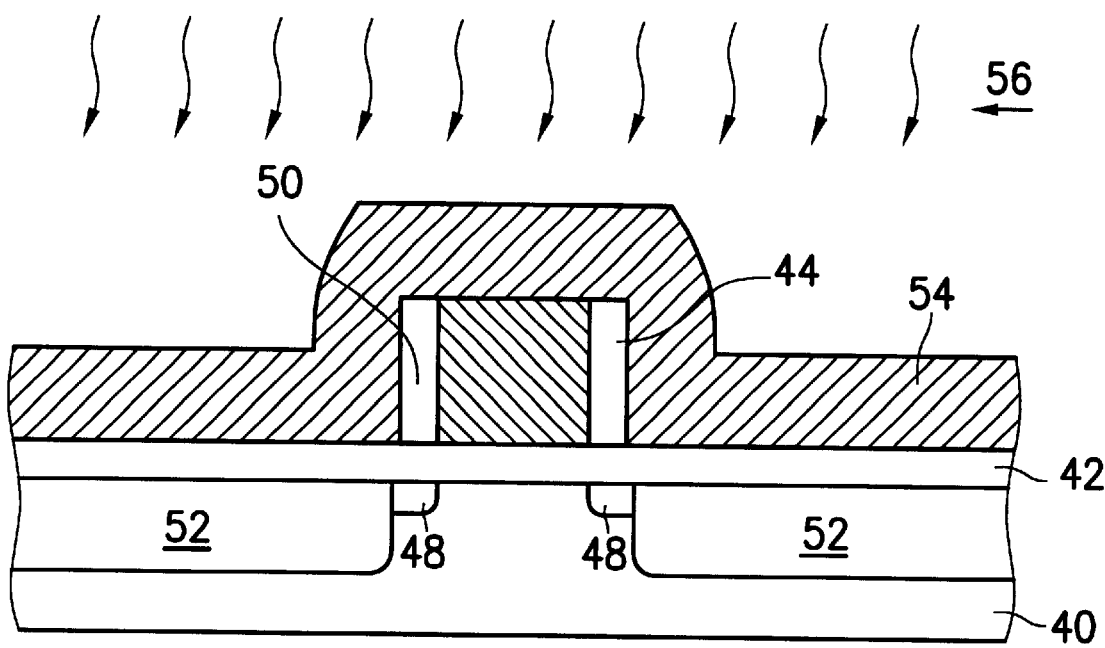
Figure 2E:
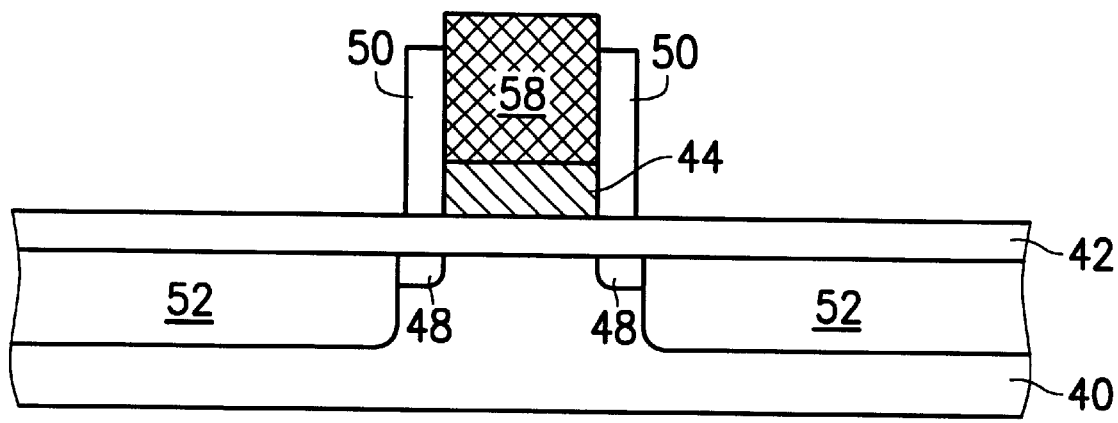

Thereafter, as shown in FIG. 2C, the sacrificial layer 46 is removed by a wet etching technique to expose the top surface of the gate conductor 44. As shown in FIG. 2D, a first layer of refractory metal 54 is then deposited across exposed surfaces of the gate dielectric 42, the poly-oxide spacer 50, and the gate conductor 44. The first layer of refractory metal 54 may be made of cobalt and titanium and approximately 300 to 800 Å thickness. The first layer of refractory metal 54 may be subjected to radiation 56 to cause the metal atoms of the first layer of refractory metal 54 to undergo cross-diffusion and reaction with silicon atoms within the gate conductor 44. Radiation 54 may be thermal radiation supplied from an anneal furnace. Preferably, radiation 54 is radiant light supplied from e.g., an arc lamp or a tungsten-halogen lamp using RTP. The presence of the relatively thick gate dielectric 42 above the source and drain regions 52 inhibits the metal atoms from interacting with silicon atoms arranged within the substrate 40. As a result, a majority of the gate conductor 44 may be converted into a silicide gate conductor 58, as shown in FIG. 2E. Over 70~80% of the thickness of the gate conductor 44 may be consumed by the metal silicide. The excess refractory metal 54 not consumed during this salicidation process is removed using a selective etch technique. The resulting silicide gate conductor 58 comprises $TiSi_2$ if Ti is used as the refractory metal and $CoSi_2$ if Co is used as the refractory metal.

Figure 2F:
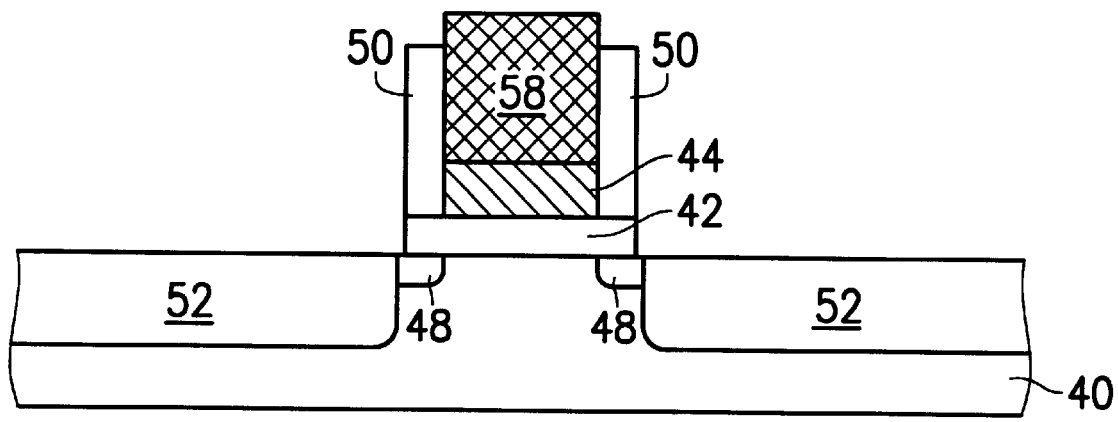
Figure 2G:
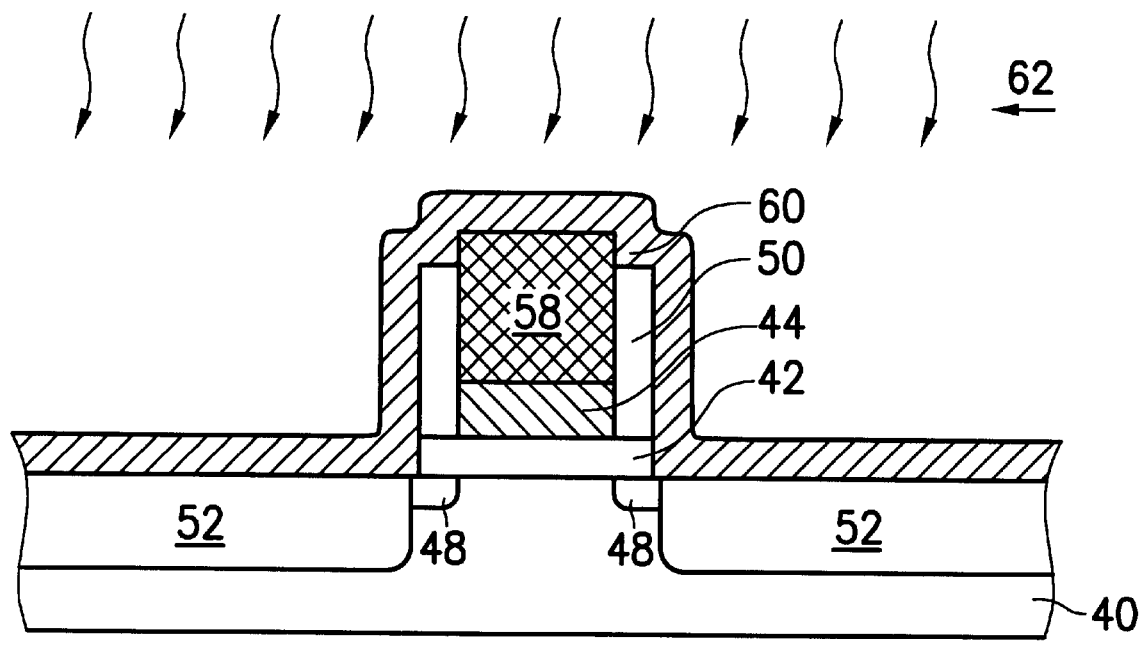
Figure 2H:
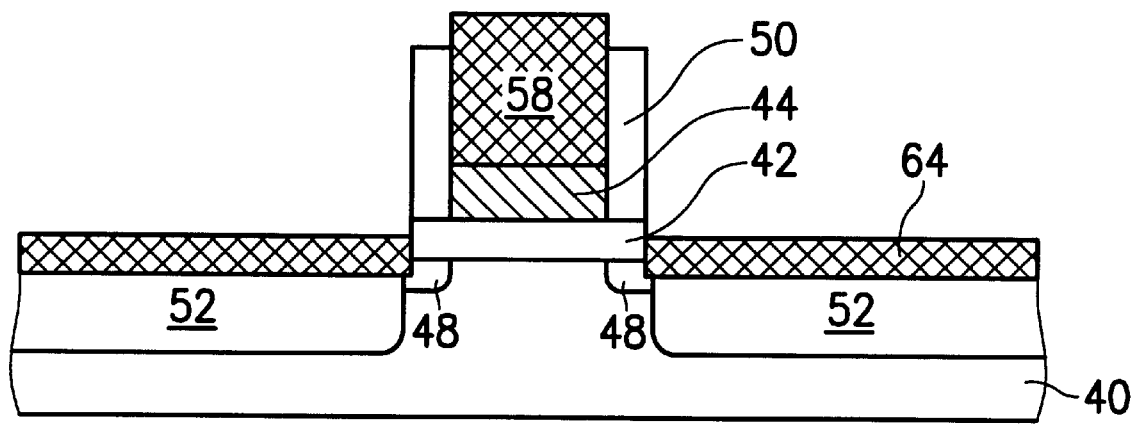

Turning to FIG. 2F, the gate dielectric 42 may then be removed from source/drain regions 52 by using a selective plasma etch technique or a non-selective plasma etch technique alternatively if a protective photoresist layer is patterned upon the gate conductor 58 and the poly-oxide spacer 50. Subsequent to exposing the source/drain regions 52, a second layer of refractory metal 60, e.g., titanium or cobalt, may be then be deposited across the semiconductor topography, as shown in FIG. 2G. The second layer of refractory metal 60 is substantially thinner than the first layer of refractory metal 54 of approximately 100 Å in thickness. The topography may then be exposed to radiation 62 to heat the second layer of refractory metal 60. As a result of being annealed, metal atoms within the second layer of refractory metal 60 may react within underlying Si atoms of the substrate 40. In this manner, silicide structures 64 comprising, e.g., $TiSi_2$ or $CoSi_2$ are formed upon the source/drain regions 52, as shown in FIG. 2H. Finally, any non-reacted refractory metal 60 may be selectively etched away.

In the present invention, a two-step salicidation process proceeds to form the silicide gate conductor 58 and the silicide structures 64 to ensures that excessive consumption of source and drain regions 52 does not occur during the formation of silicide gate conductor 58. Also, it is desirable to form a relatively thick layer of the silicide gate conductor 58 to lower the sheet resistance of the gate conductor 44. Accordingly, the dual process beneficially fabricates the silicide structures 64 on the source/drain regions 52 and silicide gate conductor 58 on the gate conductor 44 with dissimilar thicknesses. Besides, compared with the sidewall spacers in the prior art, the poly-oxide spacer 50 in the present invention is self-aligningly formed by the thermal oxidization process, and thereby the steps of depositing dielectrics and anisotropical etching can be omitted. This can simplify the dual salicidation process and is applied to fabricating a smaller-scale gate conductor.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A dual salicidation process, comprising the steps of:
    (a) providing a semiconductor substrate which comprises a gate dielectric, a polysilicon gate conductor patterned upon a predetermined area of the gate dielectric, a sacrificial layer patterned upon the polysilicon gate conductor, and LDD areas formed within the substrate at opposed sidewall of the polysilicon gate conductor;

(b) performing a thermal oxidization process to form a poly-oxide spacer on the sidewall of the polysilicon gate conductor;

(c) performing an implantation process to form source/drain regions within the substrate at the outer lateral surfaces of the poly-oxide spacer;

(d) removing the sacrificial layer;

(e) depositing a first layer of refractory metal across exposed surfaces of the gate dielectric, the poly-oxide spacer, and the polysilicon gate conductor;

(f) heating the first layer of refractory metal to convert the polysilicon gate conductor to a silicide gate conductor, (g) removing the first layer of refractory metal which is not reacted;

(h) removing the gate dielectric from the source/drain regions;

(i) depositing a second layer of refractory metal across the source/drain regions, the poly-oxide spacer, and the silicide gate conductor;

(j) heating the second layer of refractory metal to form silicide structures upon the source/drain regions; and (k) removing the second layer of refractory metal which is not reacted.

2. The dual salicidation process of claim 1, wherein the gate dielectric is made of silicon oxide.

3. The dual salicidation process of claim 1, wherein the thickness of the gate dielectric is about 50~500 Å.

4. The dual salicidation process of claim 1, wherein the sacrificial layer is made of anti-oxidization material.

5. The dual salicidation process of claim 4, wherein the sacrificial layer is made of silicon nitride.

6. The dual salicidation process of claim 4, wherein the sacrificial layer is made of silicon-oxy-nitride.

7. The dual salicidation process of claim 4, wherein the sacrificial layer is removed by a wet etching process.

8. The dual salicidation process of claim 1, wherein the thickness of the polysilicon gate conductor is approximately 200~500 Å.

9. The dual salicidation process of claim 1, wherein the thickness of the first layer of refractory metal is approximately 300~800 Å.

10. The dual salicidation process of claim 1, wherein the thickness of the second layer of refractory metal is approximately 100~150 Å.

11. The dual salicidation process of claim 1, wherein the first layer of refractory metal comprises a metal selected from the group consisting of titanium and cobalt.

12. The dual salicidation process of claim 1, wherein the second layer of refractory metal comprises a metal selected from the group consisting of titanium and cobalt.

* * * * *